United States Patent
Asako et al.

(10) Patent No.: US 8,058,153 B2
(45) Date of Patent: Nov. 15, 2011

(54) METHOD FOR RECOVERING DAMAGE OF LOW DIELECTRIC INSULATING FILM FOR MANUFACTURING SEMICONDUCTOR DEVICE

(75) Inventors: Ryuichi Asako, Tokyo (JP); Yusuke Ohsawa, Tokyo (JP)

(73) Assignee: Tokyo Electron Limited, Tokyo (JP)

( * ) Notice: Subject to any disclaimer, the term of this patent is extended or adjusted under 35 U.S.C. 154(b) by 384 days.

(21) Appl. No.: 12/137,827

(22) Filed: Jun. 12, 2008

(65) Prior Publication Data

US 2008/0311728 A1   Dec. 18, 2008

(30) Foreign Application Priority Data

Jun. 15, 2007   (JP) .................. 2007-158510

(51) Int. Cl.
*H01L 21/322* (2006.01)
(52) U.S. Cl. ............ 438/473; 438/4; 438/689; 438/780; 438/781; 257/E21.043
(58) Field of Classification Search .................. 438/473, 438/4, 689, 780–781
See application file for complete search history.

(56) References Cited

U.S. PATENT DOCUMENTS

| 2003/0083433 A1* | 5/2003 | James et al. ................. 525/54.5 |
| 2004/0029386 A1* | 2/2004 | Lee et al. ...................... 438/689 |
| 2005/0106762 A1* | 5/2005 | Chakrapani et al. ............. 438/4 |
| 2007/0273044 A1* | 11/2007 | Yang et al. .................... 257/775 |

FOREIGN PATENT DOCUMENTS

| JP | 2004-096080 A | 3/2004 |
| JP | 2005-012181 A | 1/2005 |
| JP | 2006-049798 A | 2/2006 |
| JP | 2009-032708 A | 2/2009 |

OTHER PUBLICATIONS

Japanese Office action for JP 2007-158510, dated May 19, 2009.

\* cited by examiner

*Primary Examiner* — Thanh Nguyen
(74) *Attorney, Agent, or Firm* — Pearne & Gordon LLP

(57) ABSTRACT

There is provided a damage recovery method capable of recovering electrical characteristics of a low dielectric insulating film sufficiently while suppressing oxidation of buried metal and generation of pattern defaults.

A damaged functional group generated in a surface of the low dielectric insulating film by a processing is substituted with a hydrophobic functional group (ST. 2). A damaged component present under a dense layer generated in the surface of the low dielectric insulating film by the substitution process is recovered by using an ultraviolet heating process (ST. 3).

5 Claims, 16 Drawing Sheets

FIG. 11B

| Sample | Treatment | k-Value |
|---|---|---|
| A : Initial | | 2.44 |
| B : Etch → OXIDIZING ASH | | 3.03 |
| C : Etch → OXIDIZING ASH → RESTORATION PROCESS | | 2.91 |
| D : Etch → OXIDIZING ASH → UV PROCESS | | 2.87 |
| E : Etch → OXIDIZING ASH → RESTORATION PROCESS → UV PROCESS | | 2.83 |

UV PROCESS : LONG-WAVELENGTH ULTRAVIOLET RAYS 350deg 180sec $N_2$ ATMOSPHERE 760Torr
RESTORATION PROCESS : SILYLIZING AGENT TREATMENT 180deg 150sec 50Torr

METHOD FOR RECOVERING DAMAGE OF LOW DIELECTRIC INSULATING FILM FOR MANUFACTURING SEMICONDUCTOR DEVICE

FIELD OF THE INVENTION

The present disclosure relates to a method for manufacturing a semiconductor device; and, more particularly, to a damage recovery technique for ameliorating damage inflicted on a low dielectric insulating film.

BACKGROUND OF THE INVENTION

High-integration and high-performance of a semiconductor integrated circuit have been achieved by miniaturizing the semiconductor integrated circuit. However, now that pattern sizes are reduced to nanometer dimensions, miniaturization of the semiconductor integrated circuit no more guarantees performance improvement.

Thus, as one technique to accomplish the performance improvement of the integrated circuit, attention is being paid to a technique of using an insulating film having a lower dielectric constant than that of an inorganic silicon oxide film (hereinafter, simply referred to as a Low-k film or a low dielectric insulating film) as an interlayer insulating film. A decrease of the dielectric constant of the interlayer insulating film results in a reduction of parasitic capacitance of wiring in the integrated circuit, and the reduction of the parasitic capacitance of the wiring in turn causes an increase of a signal transmission speed, thus enabling the performance improvement of the integrated circuit.

However, the Low-k film as the interlayer insulating film has a lower strength than the general inorganic silicon oxide film. Therefore, the Low-k film suffers damage while etching for pattern formation or ashing of photoresist is performed. As a result, the dielectric constant of the Low-k film increases.

To recover such damages, Patent Reference 1 (Japanese Patent Laid-open Application No. 2006-49798) discloses a method of reforming a damaged portion with a silylizing agent after the etching or ashing, that is, after the pattern formation.

However, inventors of the present application have conducted many researches and found out that a Low-k film having a damaged layer tends to adsorb moisture ($H_2O$) easily. It is deemed to be because the surface of the Low-k film having the damaged layer becomes hydrophilic. The moisture adsorbed by the Low-k film causes oxidation of a metal, e.g., wiring, buried in the Low-k film.

Furthermore, since the surface of the Low-k film is in the hydrophilic state, a cleaning solution may not be sufficiently removed in a wet cleaning process performed after a heat treatment, and it may become one factor that causes a generation of pattern defaults.

If the heat treatment is performed on the Low-k film after the pattern formation, the adsorbed moisture is evaporated from the Low-k film, whereby the oxidation of the buried metal or the generation of the pattern defaults can be prevented effectively.

However, the heat treatment alone cannot restore damaged components in the damaged layer of the Low-k film sufficiently. Therefore, the dielectric constant of the Low-k film would still remain shifted to a high level, so that electrical characteristics of the Low-k film cannot be recovered sufficiently.

BRIEF SUMMARY OF THE INVENTION

In view of the foregoing, the present disclosure provides a damage recovery method capable of recovering electrical characteristics of a low dielectric insulating film sufficiently while suppressing oxidation of buried metal and generation of pattern defaults, and the present disclosure also provides a semiconductor device manufacturing method using the damage recovery method.

In accordance with a first aspect of the present invention, there is provided a method for recovering a damage of a low dielectric insulating film made of an insulating film having a dielectric constant lower than that of an inorganic silicon oxide film, including: substituting a damaged functional group, which is generated in a surface of the low dielectric insulating film by a processing, with a hydrophobic functional group; and recovering a damage component present under a dense layer generated in the surface of the low dielectric insulating film by the substitution process by using an ultraviolet heating process.

In accordance with a second aspect of the present invention, there is provided a method for recovering a damage of a low dielectric insulating film made of an insulating film having a dielectric constant lower than that of an inorganic silicon oxide film, including: decomposing a polymer layer generated in a surface of the low dielectric insulating film by a processing by using an ultraviolet decomposition process; substituting, after decomposing the polymer layer, a damaged functional group, which is generated in the surface of the low dielectric insulating film by the processing, with a hydrophobic functional group.

In accordance with a third aspect of the present invention, there is provided a method for recovering a damage of a low dielectric insulating film made of an insulating film having a dielectric constant lower than that of an inorganic silicon oxide film, including: decomposing a polymer layer generated in a surface of the low dielectric insulating film by a processing by using an ultraviolet decomposition process; substituting, after decomposing the polymer layer, a damaged functional group, which is generated in the surface of the low dielectric insulating film by the processing, with a hydrophobic functional group; and recovering a damage component present under a dense layer generated in the surface of the low dielectric insulating film by the substitution process by using an ultraviolet heating process.

In accordance with a fourth aspect of the present invention, there is provided a method for manufacturing a semiconductor device, including: forming, on a semiconductor base body, a low dielectric insulating film made of an insulating film having a dielectric constant lower than that of an inorganic silicon oxide film; forming a desired pattern on the low dielectric insulating film by processing the low dielectric insulating film; substituting a damaged functional group, which is generated in a surface of the low dielectric insulating film by the processing, with a hydrophobic functional group; and recovering a damage component present under a dense layer generated in the surface of the low dielectric insulating film by the substitution process by using an ultraviolet heating process.

In accordance with a fifth aspect of the present invention, there is provided a method for manufacturing a semiconductor device, including: forming, on a semiconductor base body, a low dielectric insulating film made of an insulating film having a dielectric constant lower than that of an inorganic silicon oxide film; forming a desired pattern on the low dielectric insulating film by processing the low dielectric insulating film; decomposing a polymer layer generated in a surface of the low dielectric insulating film by the processing by using an ultraviolet decomposition process; and substituting, after decomposing the polymer layer, a damaged functional group, which is generated in the surface of the low dielectric insulating film by the processing, with a hydrophobic functional group.

In accordance with a sixth aspect of the present invention, there is provided a method for manufacturing a semiconductor device, including: forming, on a semiconductor base body, a low dielectric insulating film made of an insulating film having a dielectric constant lower than that of an inorganic silicon oxide film; forming a desired pattern on the low dielectric insulating film by processing the low dielectric insulating film; decomposing a polymer layer generated in a surface of the low dielectric insulating film by the processing by using an ultraviolet decomposition process; substituting, after decomposing the polymer layer, a damaged functional group, which is generated in the surface of the low dielectric insulating film by the processing, with a hydrophobic functional group; and recovering a damage component present under a dense layer generated in the surface of the low dielectric insulating film by the substitution process by using an ultraviolet heating process.

In accordance with a seventh aspect of the present invention, there is provided a method for manufacturing a semiconductor device, including: forming, on a semiconductor base body, a low dielectric insulating film made of an insulating film having a dielectric constant lower than that of an inorganic silicon oxide film; forming a desired pattern on the low dielectric insulating film by processing the low dielectric insulating film; exposing the semiconductor base body having the low dielectric insulating film of the desired pattern to a reactant gas having a Si—CH3 bond; and irradiating an ultraviolet ray to the semiconductor base body after the exposure to the reactant gas.

In accordance with an eighth aspect of the present invention, there is provided a method for manufacturing a semiconductor device, including: forming, on a semiconductor base body, a low dielectric insulating film made of an insulating film having a dielectric constant lower than that of an inorganic silicon oxide film; forming a desired pattern on the low dielectric insulating film by processing the low dielectric insulating film; irradiating an ultraviolet ray to the semiconductor base body having the low dielectric insulating film of the desired pattern; and exposing the semiconductor base body to a reactant gas having a Si—CH3 bond after the irradiation of the ultraviolet ray.

In accordance with a ninth aspect of the present invention, there is provided a method for manufacturing a semiconductor device, including: forming, on a semiconductor base body, a low dielectric insulating film made of an insulating film having a dielectric constant lower than that of an inorganic silicon oxide film; forming a desired pattern on the low dielectric insulating film by processing the low dielectric insulating film; irradiating an ultraviolet ray to the semiconductor base body having the low dielectric insulating film of the desired pattern; exposing the semiconductor base body to a reactant gas having a Si—CH3 bond after the irradiation of the ultraviolet ray; and re-irradiating an ultraviolet ray to the semiconductor base body after the exposure to the reactant gas.

In accordance with the present invention, there is provided a method for recovering electrical characteristics of a low dielectric insulating film sufficiently while suppressing oxidation of buried metal and generation of pattern defaults, and there is also provided a method for manufacturing a semiconductor device by using the damage recovery method.

BRIEF DESCRIPTION OF THE DRAWINGS

The disclosure may best be understood by reference to the following description taken in conjunction with the following figures.

DETAILED DESCRIPTION OF THE INVENTION

Hereinafter, a damage recovery method for recovering a damage of a low dielectric insulating film and a semiconductor device manufacturing method using the damage recover method will be described in accordance with embodiments of the present invention.

First Embodiment

Figure 1:
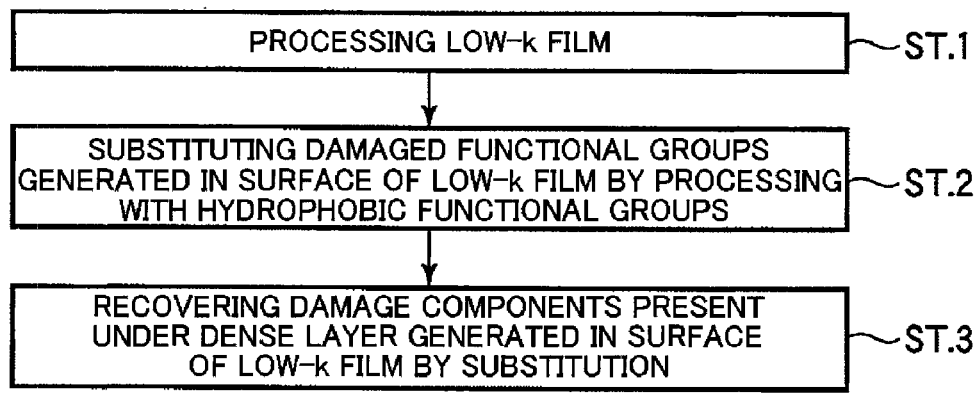
FIG. 1 provides a flowchart to describe a basic process sequence of a damage recovery method for a low dielectric insulating film (Low-k film) in accordance with a first embodiment of the present invention.

FIG. 1 sets forth a flowchart to describe a basic process sequence of a damage recovery method for a low dielectric insulating film (Low-k film) in accordance with a first embodiment of the present invention.

The basic process sequence of the damage recovery method for the Low-k film in accordance with the first embodiment is as follows.

First, as described in a step ST.1 of FIG. 1, a Low-k film is processed. During this process, damage is inflicted on the Low-k film, so that a damaged layer containing a damaged functional group is formed in the surface of the Low-k film.

Subsequently, as explained in a step ST. 2, the damaged functional group, which is generated in the surface of the Low-k film by the process in the step ST.1, is substituted with a hydrophobic functional group.

Then, as shown in a step ST. 3, a damaged component, which is present under a dense layer generated in the surface of the Low-k film by the substitution process in the step ST. 2, is recovered.

Below, an example of a semiconductor device manufacturing method using the above-described damage recovery method will be explained.

FIGS. 2 to 6 provide cross sectional views to describe a major processing sequence of the semiconductor device manufacturing method using the damage recovery method for the low dielectric insulating film in accordance with the first embodiment of the present invention.

Figure 2:
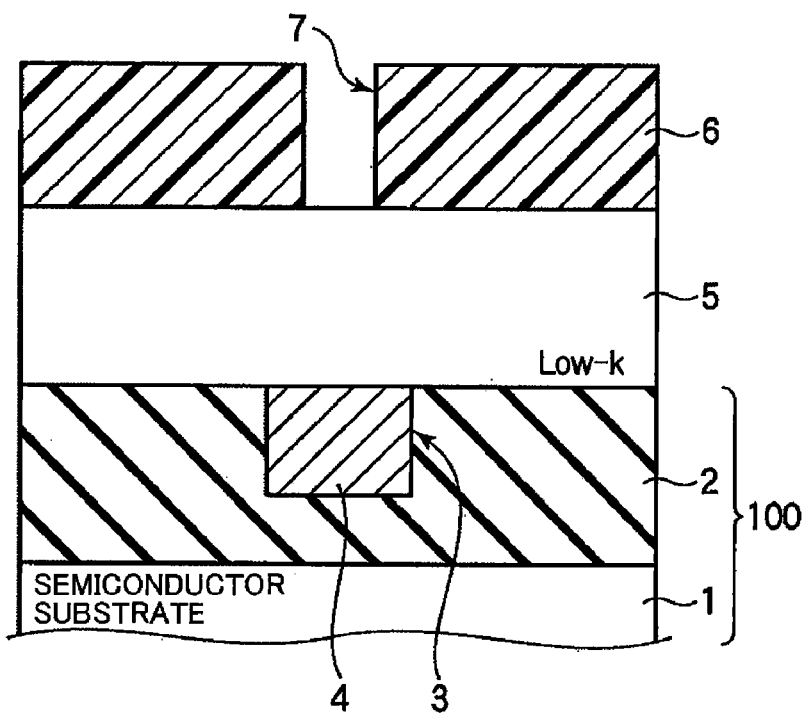
FIG. 2 sets forth a cross sectional view to illustrate a major manufacturing process of an example of a semiconductor device manufacturing method using the damage recovery method for the low dielectric insulating film in accordance with the first embodiment of the present invention.

First, as shown in FIG. 2, an interlayer insulating film 2 is formed on a semiconductor substrate (semiconductor wafer) 1, for example, on a silicon substrate. Then, a groove (wiring trench) 3 for accommodating wiring therein is formed in the interlayer insulating film 2 by employing a photolithography technique. Subsequently, the groove 3 is filled with a metal, e.g., copper by using a damascene method, so that wiring 4 is formed.

Further, in the present specification, the semiconductor substrate 1 itself, or a structure including the semiconductor substrate 1 and the interlayer insulating film 2 laminated on the semiconductor substrate 1 to insulate the wiring 4 formed on the semiconductor substrate 1 and a semiconductor device formed in the semiconductor substrate 1 is defined as a semiconductor base body 100.

Afterwards, a Low-k film 5 is formed on the semiconductor base body 100.

In the present embodiment, the Low-k film 5 is an insulating film having a dielectric constant lower than that of an inorganic silicon oxide film. For example, an inorganic silicon oxide film deposited from a source gas of TEOS (Tetra-Ethyl-Ortho-Silicate) by a CVD method has a dielectric constant k of about 4.2. Here, the dielectric constant k of the Low-k film 5 in the present embodiment is set to be less than about 4.2.

One example of an insulating film having a dielectric constant k less than about 4.2 is an organic insulating film. The organic insulating film contains a substituent for substituting a part of a main bond with another bond which reduces the dielectric constant k. The organic insulating film may be, for example, an organic silicon oxide film having a substituent for substituting a part of its main bond "Si—O" with another bond which reduces the dielectric constant k thereof.

The substituent may be, for example, an alkyl group ($-C_nH_{2n+1}$). In an organic silicon oxide film having the alkyl group, a part of the "Si—O" bond is substituted with "Si—$C_nH_{2n+1}$," so that the dielectric constant k of the organic silicon oxide film becomes lower than that of an inorganic silicon oxide film. The alkyl group may be, for example, a methyl group ($-CH_3$). In an organic silicon oxide film having the methyl group, a part of the "Si—O" bond is substituted with "Si—$CH_3$".

The organic silicon oxide film having the methyl group may be, for example, MSQ (methylsilsesquioxane). As for the MSQ, a part of its "Si—O" bond is substituted with "Si—$CH_3$". Further, since the MSQ is formed by a SOD (Spin On Dielectric) method, there is a higher likelihood that the MSQ may become porous, compared to a case of forming a film by a CVD method. As the MSQ becomes porous, its dielectric constant k is further reduced. The dielectric constant k of the MSQ is about 2.7 to 2.9.

Further, as an example of MSQ generated by using the SOD method, there is a porous MSQ whose porosity is enhanced by forming pores more actively by way of adding a thermally instable material during the formation of the MSQ and removing this material by thermal decomposition. The dielectric constant k of the porous MSQ is about 1.8 to 2.5. The Low-k film 5 in the present embodiment is the porous MSQ.

Subsequently, photoresist is coated on the Low-k film 5, so that a photoresist film 6 is formed. Then, an opening 7 is formed in the photoresist film 6 by using a photolithography technique.

Figure 3:
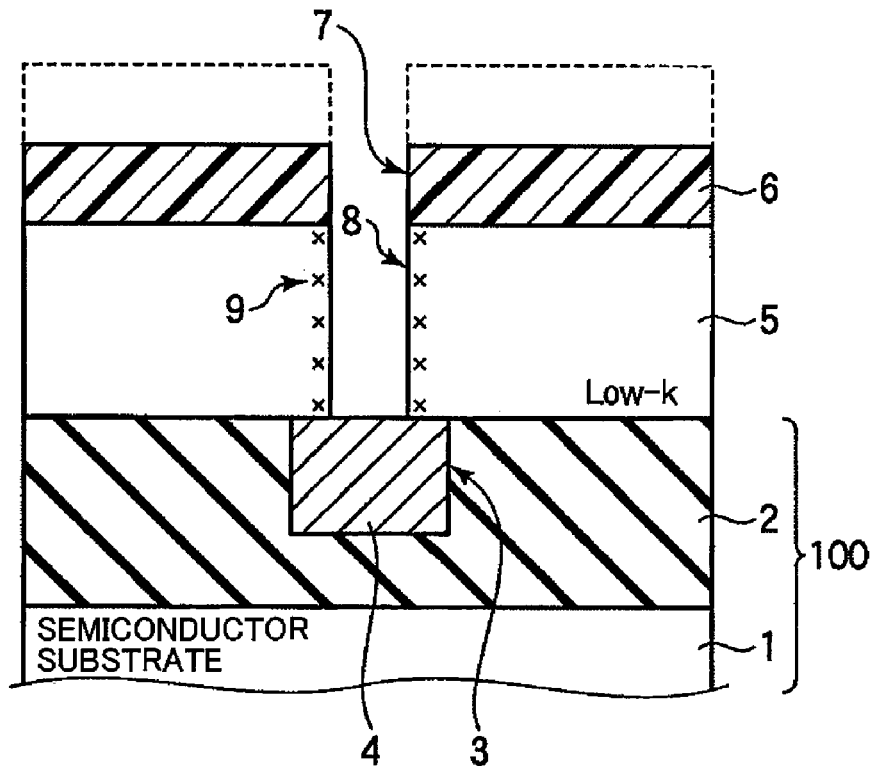
FIG. 3 presents a cross sectional view to illustrate a major manufacturing process of the example semiconductor device manufacturing method using the damage recovery method for the low dielectric insulating film in accordance with the first embodiment of the present invention.

Thereafter, as illustrated in FIG. 3, etching, for example, anisotropic etching of the Low-k film 5 is performed by using the photoresist film 6 with the opening 7 as a mask, so that a through hole (via hole or contact hole) 8 extended to the wiring 4 is formed. The anisotropic etching may be, for example, RIE (Reactive Ion Etching).

When the etching of the Low-k film 5 is performed, damage is inflicted on the Low-k film 5. Damaged portions 9 (hereinafter referred to as damage components 9) of the Low-k film 5 are schematically indicated by "x" marks. During the etching of the Low-k film 5, the damage components

9 are mainly generated in a surface of the Low-k film 5 exposed to the through hole 8.

Figure 4:
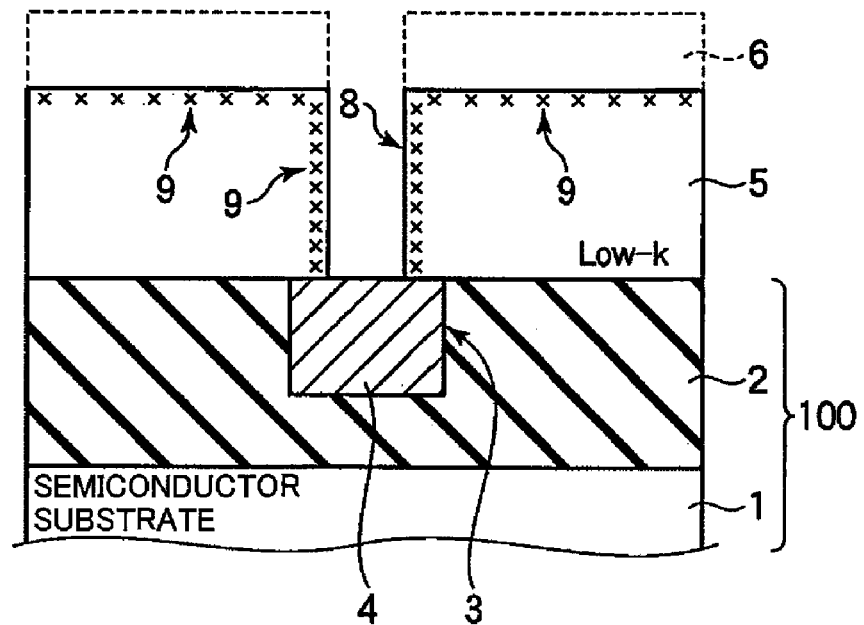
FIG. 4 offers a cross sectional view to illustrate a major manufacturing process of the example semiconductor device manufacturing method using the damage recovery method for the low dielectric insulating film in accordance with the first embodiment of the present invention.

Then, as illustrated in FIG. 4, the photoresist film 6 is removed by, for example, ashing.

While the ashing of the photoresist film 6 is performed, the Low-k film 5 is damaged as well. During the ashing of the photoresist film 6, damage components 9 are generated across the entire surface of the Low-k film 5.

Figure 5:
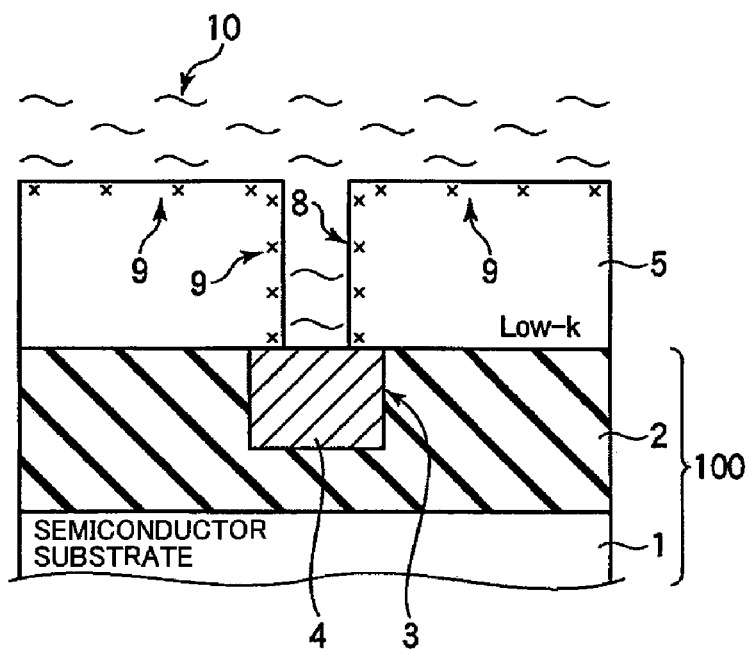
FIG. 5 shows a cross sectional view to illustrate a major manufacturing process of the example semiconductor device manufacturing method using the damage recovery method for the low dielectric insulating film in accordance with the first embodiment of the present invention.

Subsequently, as shown in FIG. 5, a damage recovery process for recovering the damage components 9 of the Low-k film 5 is carried out. In the description below, the damage recovery process is referred to as a LKR (Low-k Restoration) process. The damage components 9 are damaged functional groups. In the present embodiment, the damaged functional groups are "Si—OH" bonds. The surface of the Low-k film 5 in which many "Si—OH" bonds are generated is turned hydrophilic. In the LKR process in accordance with the present embodiment, the damaged functional groups are substituted with hydrophobic functional groups. In the present embodiment, the LKR process was performed under the following conditions:

reactant gas: TMSDMA (Trimethylsilyldimethylamine);
processing chamber internal pressure: about 50 Torr (absolute pressure);
wafer temperature: about 150° C.;
processing time: about 150 sec.

Figure 8:
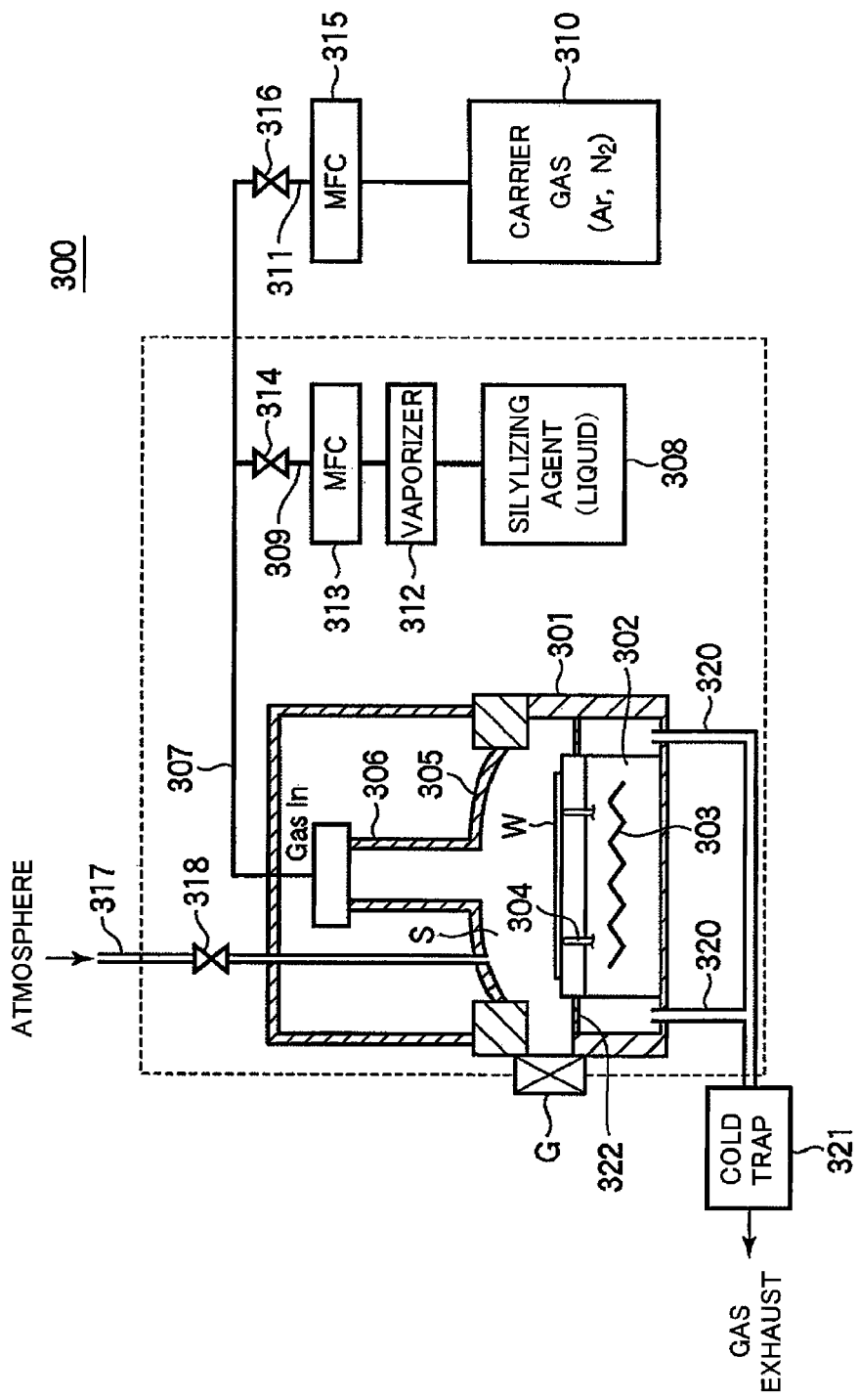
FIG. 8 illustrates an example of a configuration of a LKR processing apparatus.

An example of a LKR processing apparatus used for this LKR process is shown in FIG. 8.

As illustrated in FIG. 8, a LKR processing apparatus 300 includes a chamber 301 for accommodating a wafer W therein, and a wafer mounting table 302 is disposed in a lower portion of the chamber 301. The wafer mounting table 302 has a heater 303 embedded therein, so that the wafer W placed on the wafer mounting table 302 can be heated to a desired temperature. The wafer mounting table 302 is also provided with protrusible and retractable wafer lifting pins 304 so that the wafer W can be located at a position distanced upward from the wafer mounting table 302 when the loading and unloading of the wafer W is performed.

Inside the chamber 301, an internal vessel 305 is disposed to form a narrow processing space S accommodating the wafer W, and the reactant gas is supplied into the processing space S. Formed at the center of the internal vessel 305 is a gas inlet path 306 which extends vertically.

A gas supply line 307 is connected to a top portion of the gas inlet path 306, and coupled to the gas supply line 307 are a line 309 extended from a reaction agent supply source 308 and a line 311 extended from a carrier gas supply source 310 for supplying a carrier gas made up of Ar, $N_2$, or the like. A vaporizer 312 for vaporizing the reaction agent, a mass flow controller 313 and an opening/closing valve 314 are installed on the line 309 sequentially from the reaction agent supply source 308. Meanwhile, a mass flow controller 315 and an opening/closing valve 316 are installed on the line 311 sequentially from the carrier gas supply source 310. The reaction gas vaporized by the vaporizer 312 is introduced into the processing space S via the gas supply line 307 and the gas inlet path 306 by being carried by the carrier gas. When the LKR process is performed, the wafer W is heated by the heater 303 up to a preset temperature. Here, the temperature of the wafer W can be controlled within a range from a room temperature to about 300° C. for example.

There is provided an air inlet line 317 extended from the atmosphere outside the chamber 301 to the inside of the internal vessel 305 within the chamber 301. A valve 318 is installed on the air inlet line 317, and by opening the valve 318, air is introduced into the processing space S.

A gate valve G is provided at a sidewall of the chamber 301, and while the gate valve G is open, the loading and unloading of the wafer W is carried out. A gas exhaust line 320 is provided at the peripheral bottom portion of the chamber 301. The chamber 301 is evacuated by a vacuum pump (not shown) via the gas exhaust line 320 so that the chamber 301 can be controlled to have an internal pressure lower than or equal to, for example, about 10 Torr. A cold trap 321 is provided on the gas exhaust line 320. Further, a baffle plate 322 is provided between an upper portion of the wafer mounting table 302 and a chamber sidewall.

In the LKR process in accordance with the first embodiment, since a reactant gas 10 having Si—$CH_3$ bonds (see FIG. 5) is supplied into the processing space S, a substitution reaction takes place wherein the "Si—OH" bonds in the surface of the Low-k film 5 are substituted with the "Si—$CH_3$" bonds. Consequently, as the "Si—OH" bonds generated in the surface of the Low-k film 5 decrease, the damage components 9 are restored. Furthermore, the surface of the Low-k film 5 having many "Si—$CH_3$" bonds generated thereon is turned hydrophobic.

As described, in the LKR process, since the damaged functional groups are substituted with the hydrophobic functional groups, it is possible to reduce the damaged functional groups to thereby restore the damage.

However, the inventors of the present application have found out that the damaged functional groups generated in the Low-k film 5 can be further reduced so that the damage can be further restored. One of the reasons why further restoration is possible will be explained with reference to FIGS. 7A and 7B.

Figure 7A:
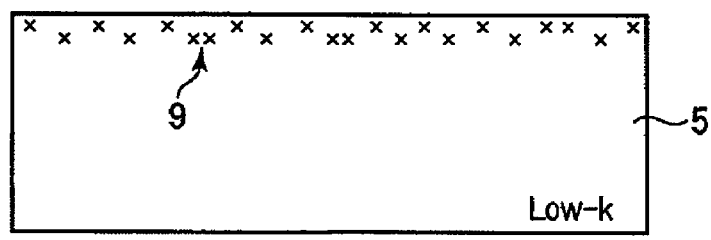
FIG. 7A is a cross sectional view schematically illustrating a Low-k film 5 immediately after ashing of a photoresist film is completed.
Figure 7B:
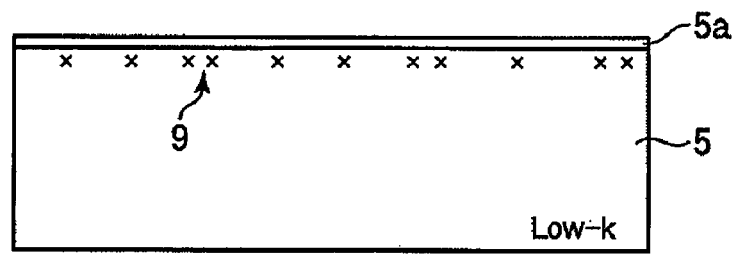
FIG. 7B is a cross sectional view schematically illustrating the Low-k film 5 immediately after a LKR (Low-k Restoration) process is completed.

FIG. 7A is a cross sectional view schematically showing the Low-k film 5 immediately after the ashing of the photoresist is completed, and FIG. 7B presents a cross sectional view schematically showing the Low-k film 5 immediately after the LKR process is completed.

As shown in FIG. 7A, the damage components (damaged functional groups) 9 are generated in the surface of the Low-k film 5 after the ashing. If the LKR process is performed on the Low-k film 5 in this state, the damage components (damaged functional groups) 9 in the surface of the Low-k film 5 are substituted with the hydrophobic functional groups, as shown in FIG. 7B, so that the damage is restored. However, while the substitution reaction takes place, the Low-k film 5 gets condensed, so that a portion having an increased density, i.e., a dense layer 5a is gradually formed in the surface of the Low-k film 5. Since the dense layer 5a has a high density, it interferes with the supply of the reactant gas 10. Therefore, the substitution reaction of the damage components (damaged functional groups) 9 is difficult to progress under the dense layer 5a. If it is to be possible to recover the damage components 9 present under the dense layer 5a, the damage of the Low-k film 5 would be further restored.

Figure 6:
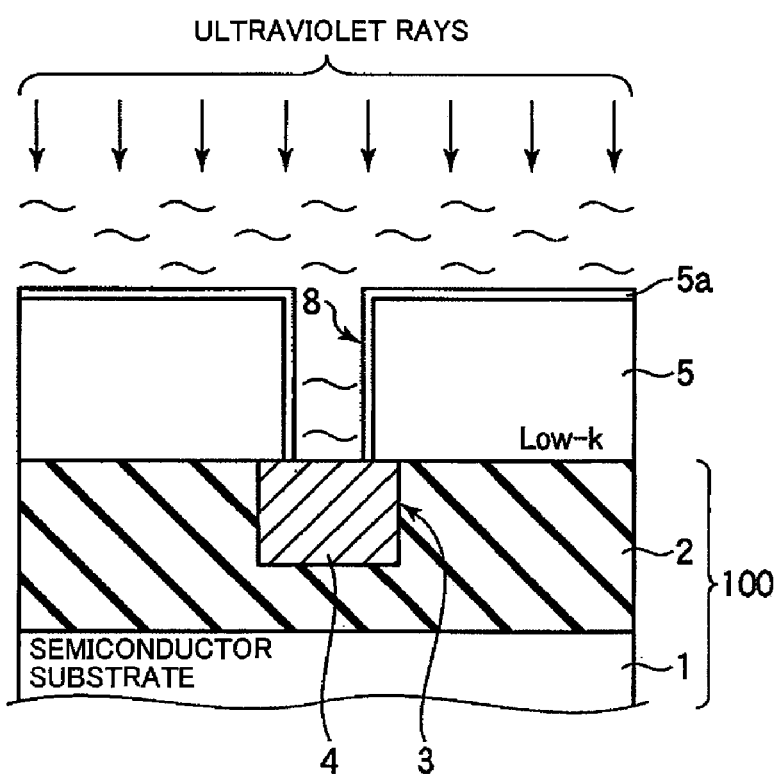
FIG. 6 depicts a cross sectional view to illustrate a major manufacturing process of the example semiconductor device manufacturing method using the damage recovery method for the low dielectric insulating film in accordance the first embodiment of the present invention.

For the purpose, in the present embodiment, there is performed a secondary damage recovery process for recovering the damage components present under the dense layer 5a generated in the surface of the Low-k film 5 by the LKR process (hereinafter referred to as a secondary LKR process), as illustrated in FIG. 6.

In the present embodiment, ultraviolet irradiation is conducted as the secondary LKR process. One example of the ultraviolet irradiation process is an ultraviolet heating process. The secondary LKR process was conducted under the following conditions:

ultraviolet rays: broadband waves of long-wavelengths (using a high pressure mercury lamp);
processing chamber internal atmosphere: nitrogen gas atmosphere;

processing chamber internal pressure: atmospheric pressure (about 760 Torr (absolute pressure));
wafer temperature: about 350° C.; and
processing time: about 180 sec.

Figure 9:
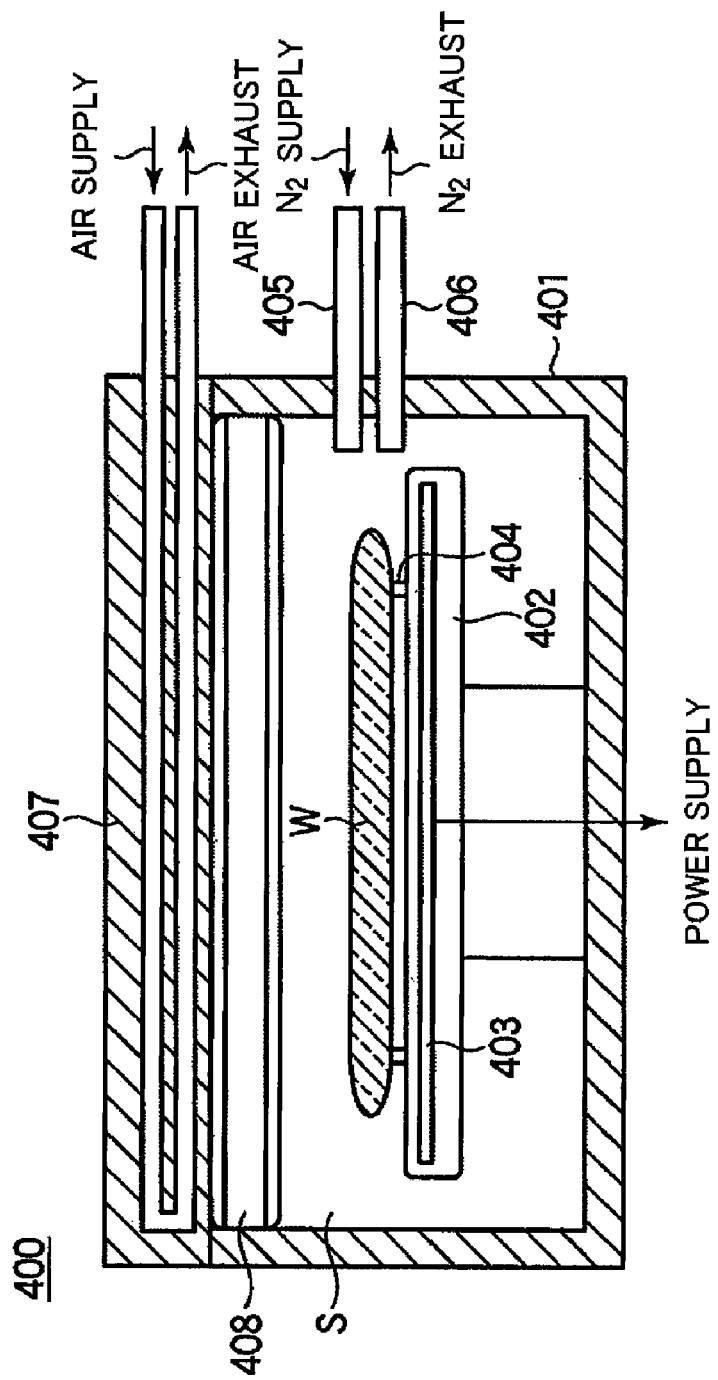
FIG. 9 illustrates an example of a configuration of an ultraviolet heating apparatus.

An example of an ultraviolet heating apparatus employed in the secondary LKR process is illustrated in FIG. 9.

Figure 10:
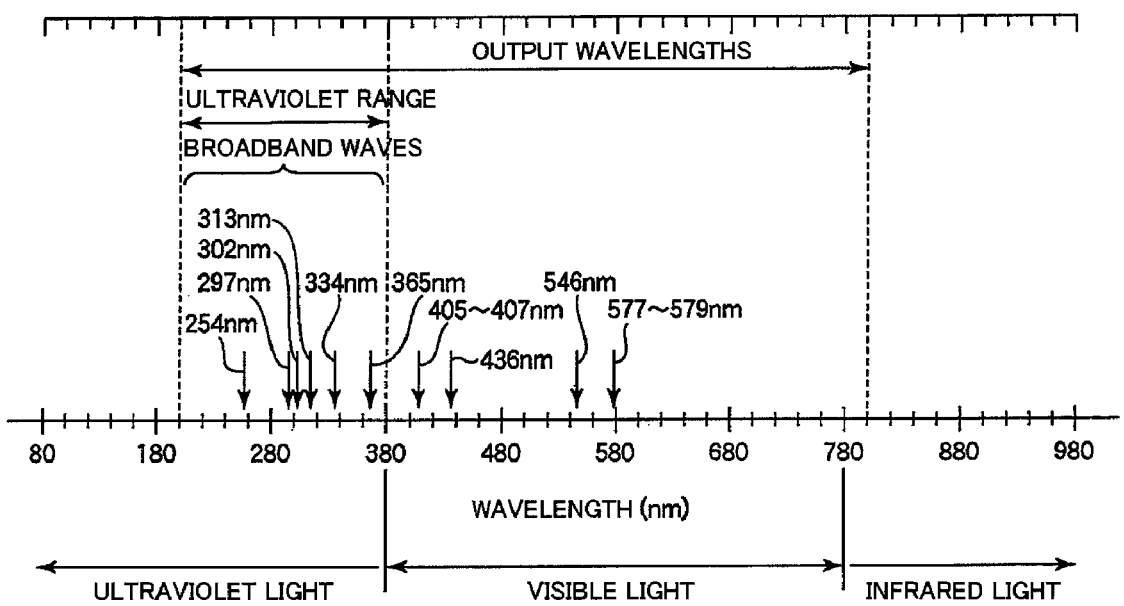
FIG. 10 provides a chart showing an output wavelength of the ultraviolet heating apparatus.

As shown in FIG. 9, an ultraviolet heating apparatus 400 includes a chamber 401 for accommodating a wafer W therein, and a wafer mounting table 402 is disposed in a lower portion of the chamber 401. The wafer mounting table 402 includes a heater 403 embedded therein. The wafer W is loaded on the wafer mounting table 402 via a proximity 404, and the wafer W can be heated to a desired temperature by the heater 403. In the present embodiment, the wafer W is heated up to 350° C. as specified above. A gas supply line 405 and a gas exhaust line 406 are connected to the chamber 401 such that a desired gas can be supplied into a processing space S formed within the chamber 401. In the present embodiment, the atmosphere inside the processing space S is set to be nitrogen gas ($N_2$) atmosphere, as specified above. An ultraviolet lamp 408 is installed at an upper portion of the chamber 401 via an air-cooling unit 407 such that ultraviolet rays can be irradiated to the wafer W in the processing space S. In the present embodiment, a high pressure mercury lamp was used as the ultraviolet lamp 408. FIG. 10 shows output wavelengths of the high pressure mercury lamp.

As shown in FIG. 10, the high pressure mercury lamp used in this embodiment outputs light having wavelengths ranging from about 200 nm to 800 nm. The light has wavelengths corresponding to an ultraviolet range of about 200 nm to 380 nm, which can be classified into a long wavelength range as an ultraviolet ray. Further, the high pressure mercury lamp generates a plurality of intense bright lines of mercury having individual wavelengths. The intense bright lines of mercury are as shown in FIG. 10, and in the above-specified ultraviolet range, a plurality of bright lines of mercury having wavelengths of about 254 nm, about 297 nm, about 302 nm, about 313 nm, about 334 nm and about 365 nm are included. The ultraviolet rays including the plurality of intense bright lines having individual wavelengths are called as broadband ultraviolet rays in this specification.

Figure 11A:
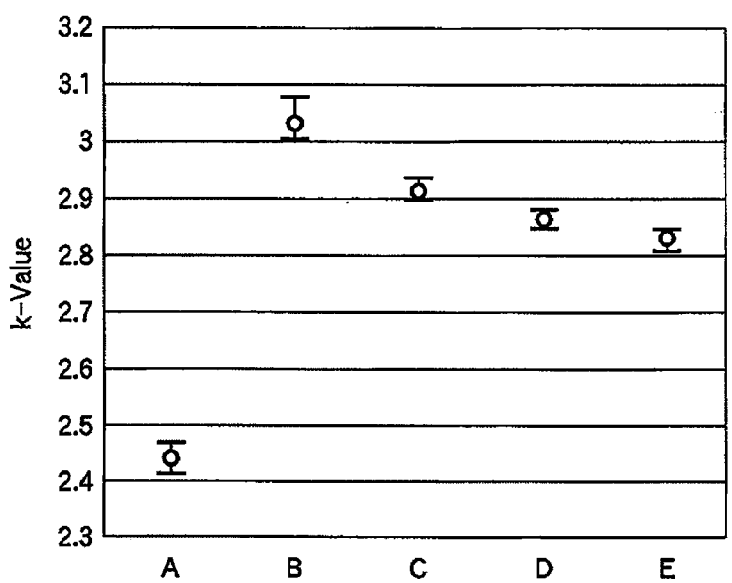
FIG. 11A describes an example of effects of the first embodiment of the present invention, and FIG. 11B specifies processing conditions.

As described, in the present embodiment, the ultraviolet irradiation process, e.g., the ultraviolet heating process was performed as the secondary LKR process, wherein a broadband ultraviolet ray within a wavelength range from about 200 nm to 380 nm was irradiated for 180 seconds in the processing space S under the nitrogen gas atmosphere while setting the wafer temperature to about 350° C. FIG. 11A shows a damage recovery effect of each sample and FIG. 11B specifies treatment conditions for each sample.

As shown in FIGS. 11A and 11B, the initial dielectric constant (k-value) of the Low-k film 5, i.e., the porous MSQ in this embodiment, was about 2.44 (Sample A).

When the oxidizing ashing of the photoresist film 6 was performed after the etching of the Low-k film 5, the k-value of the porous MSQ increased up to about 3.03 (Sample B).

When the above-described LKR process was performed after the etching and the oxidizing ashing, the k-value of the porous MSQ was recovered to about 2.91 (Sample C).

When the above-described ultraviolet heating process (UV process) was performed after the etching and the oxidizing ashing, the k-value of the porous MSQ was recovered to 2.87 (Sample D).

When the above-described LKR process and UV process were both performed after the etching and the oxidizing ashing, the k-value of the porous MSQ was recovered to 2.83 (Sample E).

As described, by performing the UV process on the processed Low-k film 5 as the secondary LKR process in addition to the LKR process, the k-value could be improved as much as a value of about 0.2, compared to the case of performing only the LKR process.

As described, in the damage recovery method for the low dielectric insulating film (Low-k film) in accordance with the first embodiment of the present invention, since the damaged functional groups generated in the surface of the low dielectric insulating film (Low-k film) by the processing are substituted with the hydrophobic functional groups, the surface of the processed Low-k film can be rendered hydrophobic. Therefore, in comparison with the case the surface of the Low-k film is hydrophilic, a cleaning agent can be more sufficiently removed in a wet cleaning process. If the cleaning agent can be sufficiently removed, one factor that might cause pattern defaults can be reduced, so that the generation of the pattern defaults can be prevented.

Furthermore, though the substitution process may cause the generation of the dense layer on the surface of the low dielectric insulating film, the damage components present under the dense layer can be recovered by using the ultraviolet heating process. Therefore, the damage components can be further reduced in comparison with the case where the recovery of the damage components under the dense layer is not carried out, so that the electrical characteristics of the low dielectric insulating film can be sufficiently recovered.

Further, since the above-explained damage recovery method involves a heating process of heating the substrate, the moisture adsorbed in the damaged layer of the low dielectric insulating film, i.e., $H_2O$ can be eliminated, so that metal oxidation due to the adsorbed moisture can be suppressed.

As described, by the damage recovery method for the low dielectric insulating film in accordance with the first embodiment of the present invention, the electrical characteristics of the low dielectric insulating film can be recovered sufficiently, while suppressing oxidation of buried metal and generation of pattern defaults.

If a semiconductor device is manufactured by employing the present damage recovery method, the manufactured semiconductor device would be given, for example, an interlayer insulating film whose dielectric constant is sufficiently lowered, so that it is possible to obtain a high-performance semiconductor integrated circuit featuring a high signal transmission speed.

Moreover, since the generation of the pattern defaults is prevented, the manufacture of the high-performance semiconductor integrated circuit can be accomplished with a high yield.

Furthermore, since the amount of the adsorbed moisture in the interlayer insulating film is reduced, the oxidation of the metal wiring buried in the interlayer insulating film can be suppressed, which in turn enables an increase of the lifetime of the high-performance semiconductor integrated circuit.

Second Embodiment

Figure 12:
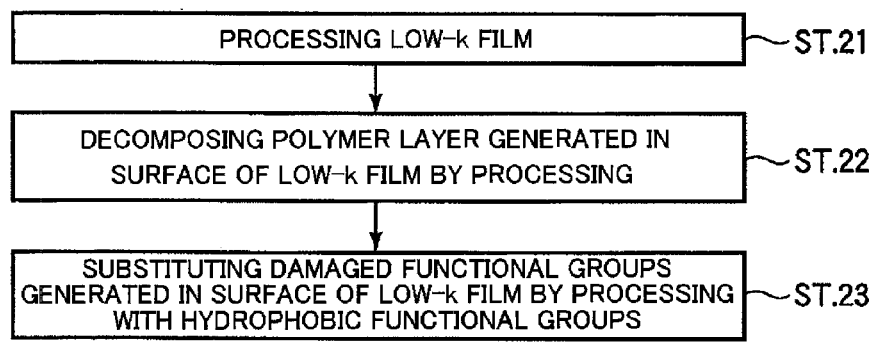
FIG. 12 is a flowchart to describe a basic process sequence of a damage recovery method for a low dielectric insulating film (Low-k) film in accordance with a second embodiment of the present invention.

Referring to FIG. 12, there is provided a flow chart for describing a basic process sequence of a damage recovery method for a low dielectric insulating film (Low-k film) in accordance with a second embodiment of the present invention.

The basic process sequence of the damage recovery method for the Low-k film in accordance with the second embodiment is as follows.

First, as explained in a step ST.21 of FIG. 12, a Low-k film is processed. During this process, a polymer layer is generated in the surface of the Low-k film. Further, damage is inflicted on the Low-k film, so that a damaged layer containing damaged functional groups is formed in the surface of the Low-k film.

Subsequently, as described in a step ST.22, the polymer layer generated in the surface of the Low-k film by the process of the step ST.21 is decomposed.

Then, as explained in a step ST. 23, the damaged functional groups generated in the surface of the Low-k film by the process of the step ST. 21 are substituted with hydrophobic functional groups after decomposing the polymer layer.

An example of a semiconductor device manufacturing method using the damage recovery method will be explained below.

FIGS. 13 to 16 provide cross sectional views to describe a major processing sequence of the example of the semiconductor device manufacturing method using the damage recovery method for a low dielectric insulating film in accordance with the second embodiment of the present invention.

First, in accordance with the manufacturing method described in FIG. 2, a Low-k film 5 is formed on a semiconductor base body 100. The Low-k film 5 in the second embodiment may be the same as the Low-k film 5 of the first embodiment. Specifically, an insulating film having a dielectric constant lower than that of an inorganic silicon oxide film, e.g., less than about 4.2, is used as the Low-k film 5. One example of the insulating film having a dielectric constant k less than about 4.2 may be an organic insulating film containing a substituent which substitutes a part of a main bond with another bond that reduces the dielectric constant k thereof, as in the first embodiment. The organic insulating film may be, for example, an organic silicon oxide film having a substituent which substitutes a part of its main bond "Si—O—Si" with another bond that reduces the dielectric constant k thereof, as in the first embodiment. The substituent may be, for example, an alkyl group ($—C_nH_{2n+1}$), and the alkyl group may be, for example, a methyl group ($—CH_3$). An organic silicon oxide film containing the methyl group may be, for example, MSQ or porous MSQ, as in the first embodiment. In the present embodiment, the Low-k film 5 is porous MSQ.

Figure 13:
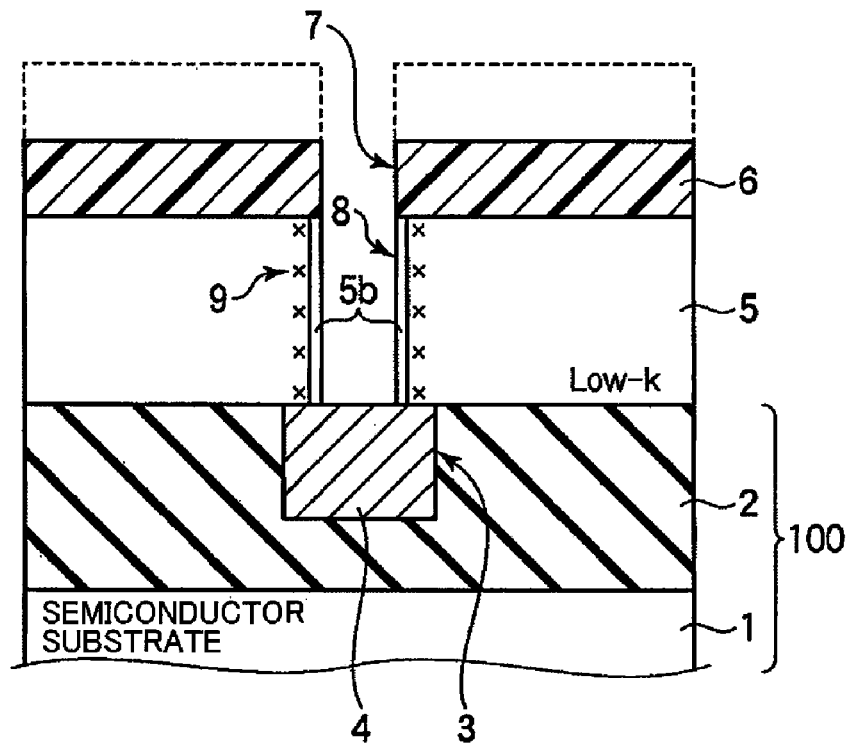
FIG. 13 sets forth a cross sectional view to illustrate a major manufacturing process of the example semiconductor device manufacturing method using the damage recovery method for the low dielectric insulating film in accordance with the second embodiment of the present invention.

Then, as illustrated in FIG. 13, etching, for example, anisotropic etching of the Low-k film 5 is performed by using a photoresist film 6 having an opening 7 on the Low-k film 5 as a mask in accordance with the manufacturing method described in FIG. 3, so that a through hole (via hole or contact hole) 8 extended to wiring 4 is formed. The anisotropic etching may be, for example, RIE.

In the second embodiment, the Low-k film 5 is also damaged during the etching, and damage components 9 are generated in the surface thereof. Further, a polymer layer 5b is generated in the surface of the Low-k film 5. In the process step shown in FIG. 13, the polymer layer 5b is formed in the surface of the Low-k film 5 exposed to the through hole 8.

Figure 14:
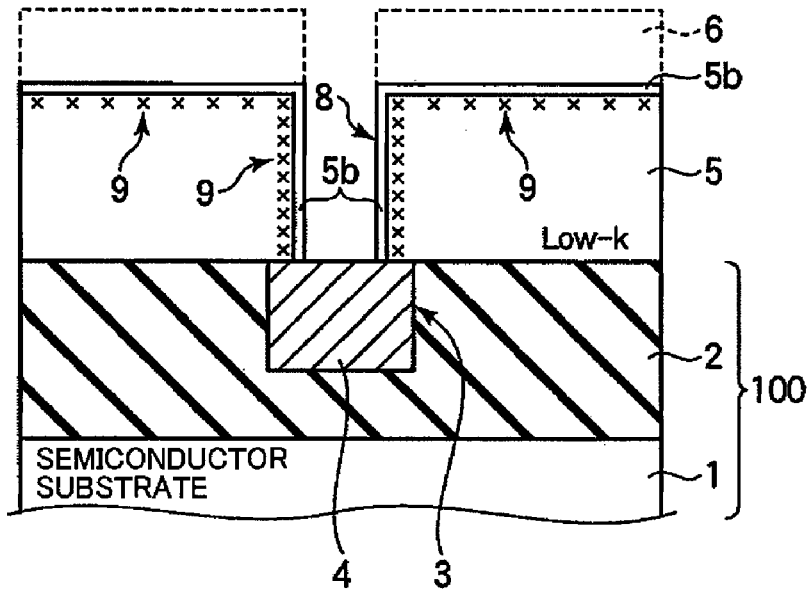
FIG. 14 provides a cross sectional view to illustrate a major manufacturing process of the example semiconductor device manufacturing method using the damage recovery method for the low dielectric insulating film in accordance with the second embodiment of the present invention.

Subsequently, as illustrated in FIG. 14, the photoresist film 6 is removed by, for example, ashing.

In the second embodiment, the Low-k film 5 is also damaged by the ashing, and a polymer layer 5b is generated in the surface of the Low-k film 5. As shown in FIG. 14, damage components 9 are generated across the entire surface of the Low-k film 5, and the polymer layer 5b is formed across the entire surface of the Low-k film 5 if the ashing of the photoresist film 6 was performed.

In this state, it is impossible or difficult to recover damage even if the LKR process described in the first embodiment is performed on the Low-k film 5. The reason for this will be explained with reference to FIGS. 17A and 17B.

Figure 17A:
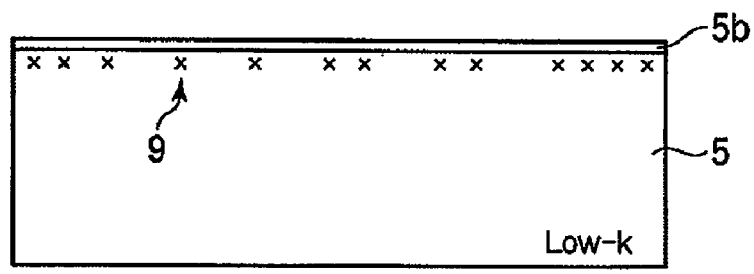
FIG. 17A is a cross sectional view schematically illustrating a Low-k film 5 immediately after ashing of a photoresist film is completed.
Figure 17B:
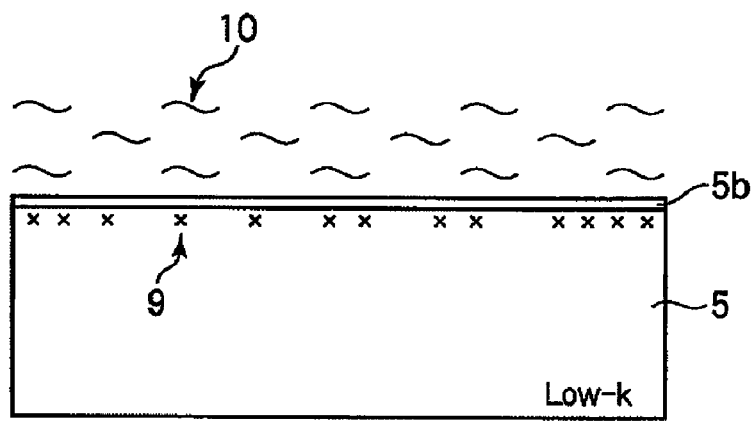
FIG. 17B is a cross sectional view illustrating the Low-k film 5 immediately after a LKR process is completed.

FIG. 17A is a cross sectional view schematically illustrating the Low-k film 5 immediately after the ashing of the photoresist film is completed, and FIG. 17B present a cross sectional view schematically illustrating the Low-k film 5 immediately after the LKR process is completed.

As illustrated in FIG. 17A, the damage components (damaged functional groups) 9 and the polymer layer 5b are generated in the surface of the Low-k film 5 immediately after the ashing. If the LKR process is performed on the Low-k film 5 in this state, the supply of a reactant gas 10 is blocked by the polymer layer 5b as shown in FIG. 17B, making it impossible or difficult for the reactant gas 10 to reach the damage components (damaged functional groups) 9. Therefore, in the Low-k film 5 having the polymer layer 5b generated in the surface thereof, a substitution reaction of the damage components (damaged functional groups) is impossible or difficult to take place. If it is to be possible to recover the damage components 9 present under the polymer layer 5b, the damage of the Low-k film 5 would be restored.

Figure 15:
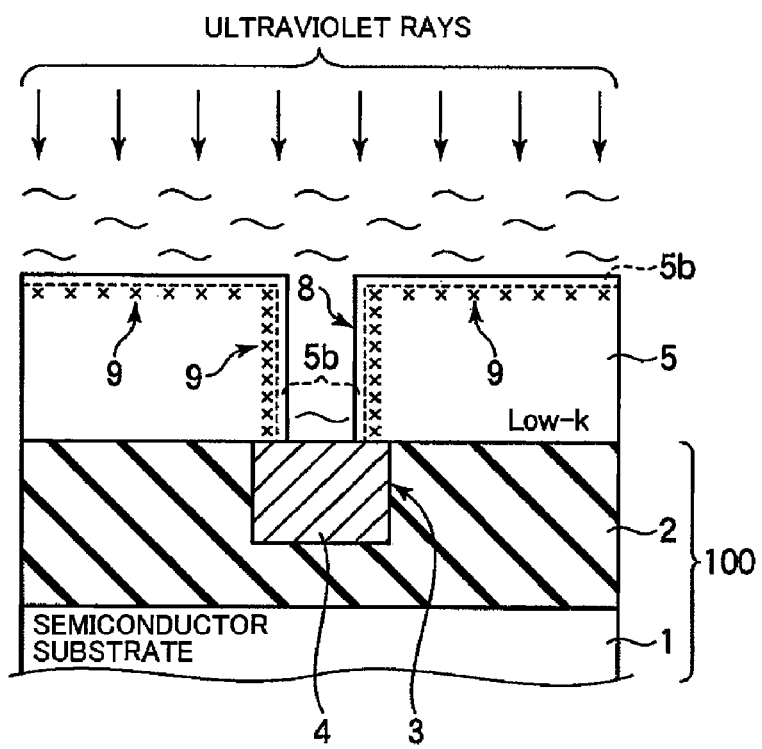
FIG. 15 presents a cross sectional view to illustrate a major manufacturing process of the example semiconductor device manufacturing method using the damage recovery method for the low dielectric insulating film in accordance with the second embodiment of the present invention.

For the purpose, in the present embodiment, there is performed a decomposition process for decomposing the polymer layer 5b generated in the surface of the Low-k film 5, as shown in FIG. 15.

In the present embodiment, ultraviolet irradiation is employed as the decomposition process. One example of the ultraviolet irradiation process is an ultraviolet decomposition process. The ultraviolet decomposition process was performed under the following conditions:

ultraviolet rays: a single wavelength wave of a short-wavelength (using an excimer lamp);

processing chamber internal atmosphere: atmospheric atmosphere;

processing chamber internal pressure: atmospheric pressure (about 760 Torr (absolute pressure));

wafer temperature: room temperature (no temperature control); and processing time: about 10 seconds.

Figure 18:
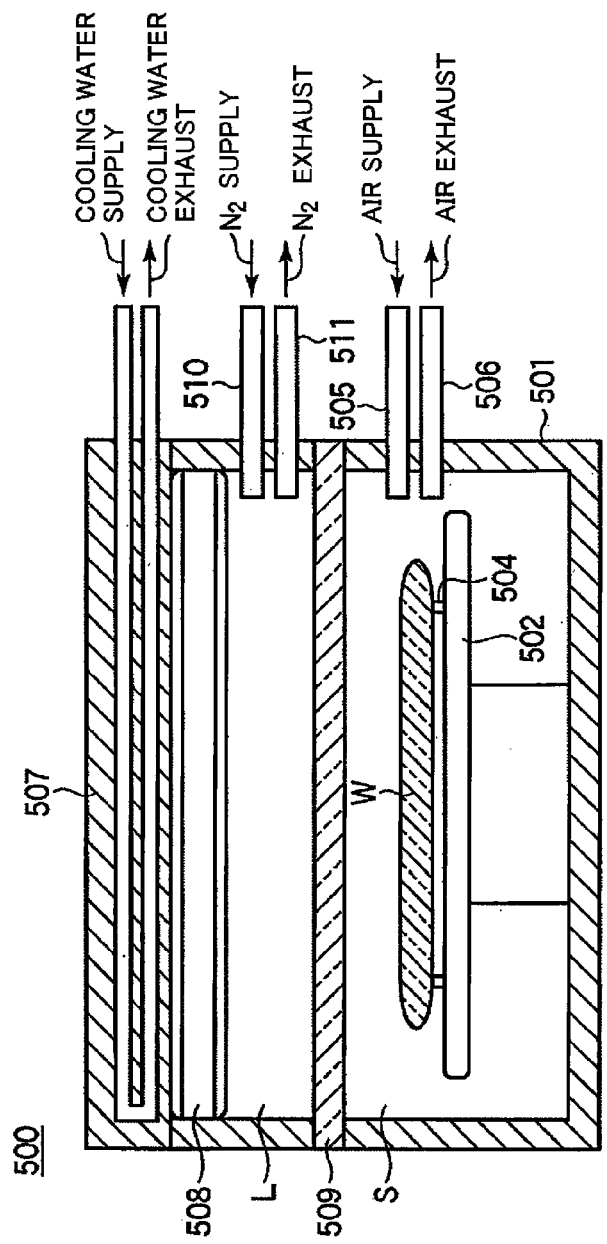
FIG. 18 illustrates an example of a configuration of an ultraviolet decomposing apparatus.

An example of an ultraviolet heating apparatus used for this decomposition process is illustrated in FIG. 18.

Figures 19, 20:
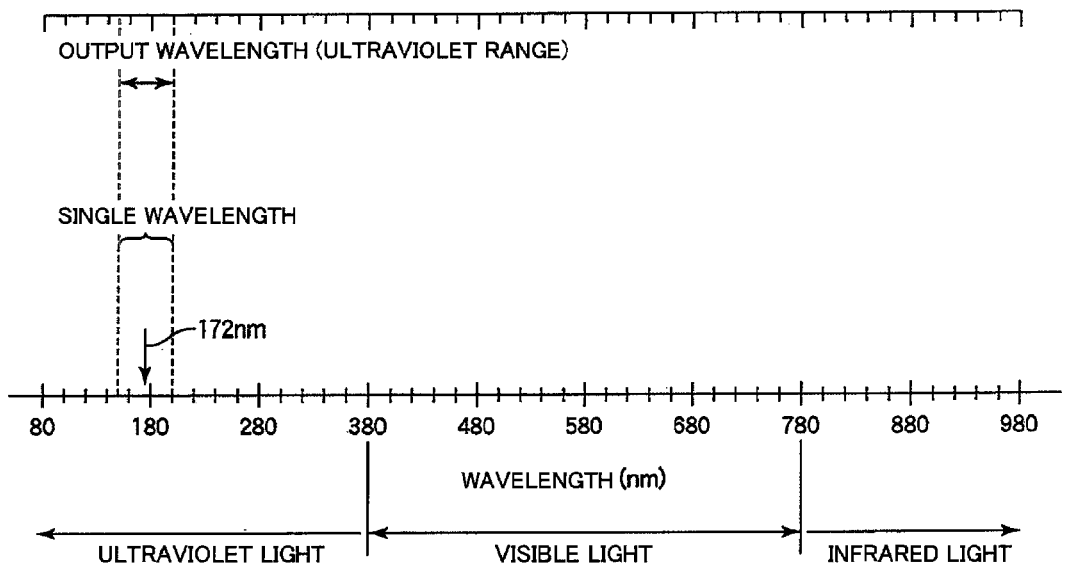
FIG. 19 provides a chart showing an output wavelength of the ultraviolet decomposing apparatus.
FIG. 20 sets forth an example of effects of the second embodiment of the present invention.

As shown in FIG. 18, an ultraviolet heating apparatus 500 includes a chamber 501 for accommodating a wafer W therein, and a wafer mounting table 502 is disposed in a lower portion of the chamber 501. The wafer W is loaded on the wafer mounting table 502 via a proximity 504. A gas supply line 505 and a gas exhaust line 506 are connected to the chamber 501 such that a desired gas can be supplied into a processing space S formed within the chamber 501. In the present embodiment, the processing space S was set to be under the atmospheric atmosphere, as specified above. However, the atmosphere inside the processing space S is not limited to the atmospheric atmosphere, but can be set to be nitrogen gas ($N_2$) atmosphere. When the nitrogen gas atmosphere is set up, it is desirable to supply a nitrogen gas into the processing space S from the gas supply line 505. An ultraviolet lamp 508 is installed at an upper portion of the chamber 501 via a water-cooling unit 507 such that ultraviolet rays can be irradiated to the wafer W in the processing space S. The ultraviolet lamp 508 is accommodated in a lamp room L comparted from the processing space S by a quartz glass 509. A gas supply line 510 and a gas exhaust line 511 are connected to the lamp room L such that a desired gas can be supplied into the lamp room L. In the present embodiment, the lamp room L was set to be under nitrogen gas ($N_2$) atmosphere as shown in FIG. 18. In the present embodiment, an excimer lamp was used as the ultraviolet lamp 508. FIG. 19 shows an output wavelength of the excimer lamp.

As shown in FIG. 19, the excimer lamp used in this embodiment outputs light having a wavelength ranging from about 150 nm to 200 nm. The entire wavelength range of the light belongs to an ultraviolet range, which can be classified into a short wavelength range as an ultraviolet ray. Further, the excimer lamp generates an intense bright line of a substantially single wavelength. The intense bright line of a substantially single wavelength is as shown in FIG. 19, and in the present embodiment, its wavelength is about 172 nm. The ultraviolet rays including the intense bright line of a substantially single wavelength are called as single wavelength ultraviolet rays in this specification.

As described, in the present embodiment, the ultraviolet irradiation process, e.g., the ultraviolet decomposition process was performed to decompose the polymer layer 5b, wherein single wavelength ultraviolet rays within a wavelength range from about 150 nm to 200 nm were irradiated for 10 seconds in the processing space S under the atmospheric atmosphere while setting the wafer temperature to a room temperature (no temperature control is performed). FIG. 20 shows a damage recovery effect of each sample.

As shown in FIG. 20, the initial dielectric constant (k-value) of the Low-k film 5, i.e., the porous MSQ in this embodiment, was about 2.38 (Initial).

When the etching of the Low-k film 5 and the oxidizing ashing of the photoresist film 6 were performed under the processing conditions as defined in the second embodiment, the k-value of the porous MSQ increased up to 3.27 (Etch+ $N_2/H_2$Ash, No LKR).

When the ultraviolet decomposition process as described in the second embodiment was performed after the etching and the ashing process, the k-value of the porous MSQ further increased up to 3.33 (Etch+$N_2/H_2$Ash, UV).

However, when the ultraviolet decomposition process of the second embodiment and the LKR process (under the same processing conditions as described in the first embodiment) are both performed after the etching and the ashing process, the k-value of the porous MSQ was recovered to 2.69 (Etch+ $N_2/H_2$Ash, UV+LKR).

Further, though not shown in FIG. 20, when only the LKR process (under the same processing conditions as described in the first embodiment) was performed after the etching of the Low-k film 5 and the oxidizing ashing of the photoresist film 6 were performed under the processing conditions described in the second embodiment, no recovery of the k-value of the porous MSQ was observed. That is, the dielectric constant at this time was almost identical with the dielectric constant 3.27 measured when the LKR process was not performed.

Figure 16:
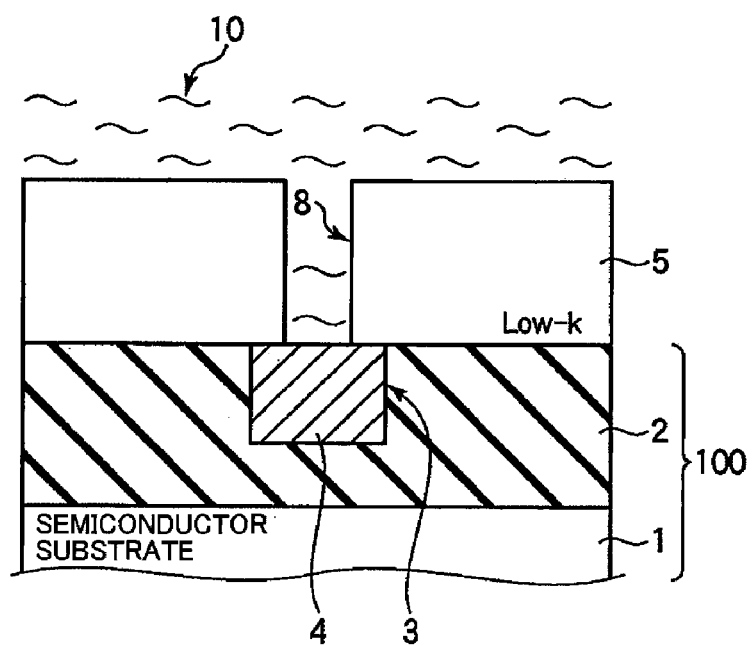
FIG. 16 offers a cross sectional view to illustrate a major manufacturing process of the example semiconductor device manufacturing method using the damage recovery method for the low dielectric insulating film in accordance with the second embodiment of the present invention.

As described, when the LKR process was performed on the processed Low-k film 5 with the reactant gas 10 as in the first embodiment, as illustrated in FIG. 16, after carrying out the decomposition process for decomposing the polymer layer 5b, the k-value (3.27 at this time) could be improved as much as a value of about 0.58, compared to the case without performing the decomposition process.

As described, in the damage recovery method for the low dielectric insulating film (Low-k film) in accordance with the second embodiment of the present invention, the polymer layer generated in the surface of the Low-k film by the processing is decomposed by the ultraviolet decomposition process and, after that, the damaged functional groups generated in the surface of the Low-k film by the processing are substituted with the hydrophobic functional groups. Thus, in comparison with the case of substituting the damaged functional groups with the hydrophobic functional groups in the state where the polymer layer exists, the substitution can be more facilitated. Since the substitution is facilitated, the damage components can be reduced in comparison with the case where the polymer layer exists, so that electrical characteristics of the Low-k film can be sufficiently recovered.

Further, since the substitution of the hydrophobic functional groups for the damaged functional groups is facilitated, the surface of the processed Low-k film can be rendered hydrophobic after the processing. Therefore, in comparison with the case in which the surface of the Low-k film is hydrophilic, a cleaning agent can be more sufficiently removed in a wet cleaning process. If the cleaning agent can be sufficiently removed, one factor that might cause pattern defaults can be reduced, so that the generation of the pattern defaults can be prevented.

Further, since the above-explained damage recovery method involves a heating process of heating the substrate, the moisture adsorbed in the damaged layer of the low dielectric insulating film, i.e., $H_2O$ can be eliminated, so that metal oxidation due to the adsorbed moisture can be suppressed.

As described, by the damage recovery method for the low dielectric insulating film in accordance with the second embodiment of the present invention, the electrical characteristics of the low dielectric insulating film can be recovered sufficiently, while suppressing oxidation of buried metal and generation of pattern defaults.

If a semiconductor device is manufactured by employing the present damage recovery method, the manufactured semiconductor device would be given an interlayer insulating film whose dielectric constant is sufficiently lowered, so that it is possible to obtain a high-performance semiconductor integrated circuit featuring a high signal transmission speed.

Moreover, since the generation of the pattern defaults is prevented, the manufacture of the high-performance semiconductor integrated circuit can be accomplished with a high yield.

Furthermore, since the amount of the adsorbed moisture in the interlayer insulating film is reduced, the oxidation of the metal wiring buried in the interlayer insulating film can be suppressed, which in turn enables an increase of the lifetime of the high-performance semiconductor integrated circuit.

Third Embodiment

Figure 21:
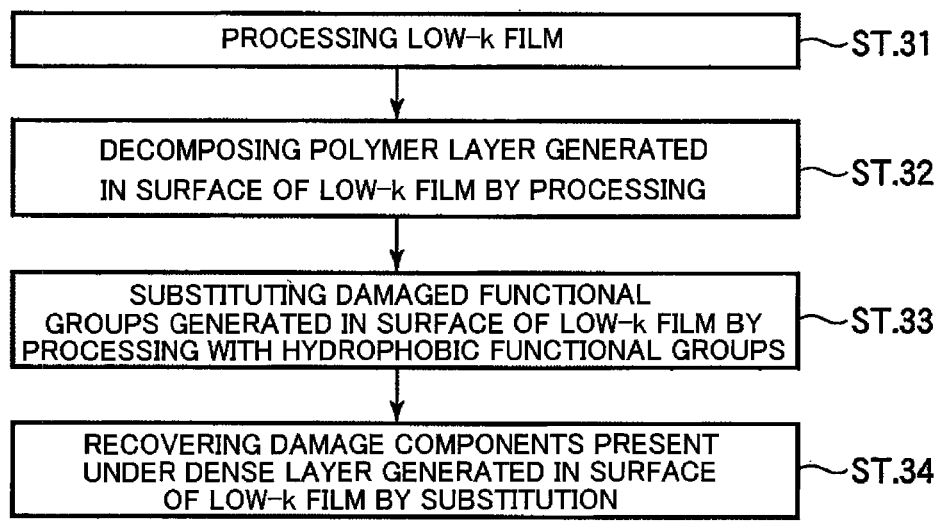
FIG. 21 presents a flowchart to describe a basic process sequence of a damage recovery method for a low dielectric insulating film (Low-k) film in accordance with a third embodiment of the present invention.

Referring to FIG. 21, there is provided a flowchart to describe a basic process sequence of a damage recovery method for a low dielectric insulating film (Low-k film) in accordance with a third embodiment of the present invention.

The third embodiment is implemented by a combination of the first and second embodiments, and a basic process of the damage recovery method in accordance with the third embodiment is as follows.

First, as described in a step ST.31 of FIG. 21, a Low-k film is processed. During this process, a polymer layer is generated in a surface of the Low-k film, and a damaged layer containing damaged functional groups is also generated.

Then, as explained in a step ST.32, the polymer layer generated in the surface of the Low-k film by the process of the step ST. 31 is decomposed by a decomposition method described in the second embodiment.

Thereafter, as shown in a step ST. 33, the damaged functional groups generated in the surface of the Low-k film by the process of the step ST.31 are substituted with hydrophobic functional groups, after decomposing the polymer layer.

Subsequently, as described in a step ST. 34, damage components present under a dense layer generated in the surface of the Low-k film by the substitution process of the step ST. 33 are recovered.

As explained, it is possible to combine the first and second embodiments.

When the first and second embodiments are combined as in the third embodiment, the advantages of the first and second embodiments can be all obtained.

Furthermore, though not shown, a semiconductor device can be manufactured by using the damage recovery method for the low dielectric insulating film in accordance with the third embodiment.

Though the present invention has been described with respect to the first to the third embodiments, the present invention is not limited thereto, but can be modified in various ways.

For example, in the first to the third embodiments, though the damage recovery method for the low dielectric insulating film is applied to the formation of through holes (via holes or contact holes) in an interlayer insulating film made up of a low dielectric insulating film, the damage recovery method can also be applied to the formation of, for example, damascene wiring grooves in an interlayer insulating film made up of a low dielectric insulating film.

Moreover, the damage recovery method in accordance with the present invention is capable of recovering electrical characteristics of a low dielectric insulating film sufficiently, while suppressing generation of pattern defaults. Therefore, the present method is not limited to the formation of a damascene wiring groove or a through hole, but can be applied to various processes for the low dielectric insulating film.

Furthermore, though the MSQ or porous MSQ is used as the low dielectric insulating film (Low-k film) in the first to the third embodiments, any other insulating film can also be used as long as its dielectric constant is lower than that of an inorganic silicon oxide film, desirably. For example, an organic insulating film containing a substituent which substitutes a part of a main bond with another bond that reduces a dielectric constant k may be desirably employed. One example of the organic insulating film may be an organic silicon oxide film, and, as the organic silicon oxide film, a SiOC-based film including both of a "Si—O" bond and a "Si—CH$_3$" bond, which is generated by adding a methyl group (—CH$_3$) to the "Si—O" bond, may be employed, in addition to the MSQ or porous MSQ.

In addition, though TMSDMA (Trimethylsilyldimethylamine) is used as the reactant gas for use in the LKR process in the first to the third embodiment, any other gas can be employed as long as it has a bond of Si and an alkyl group (—C$_n$H$_{2n+1}$), desirably. One example of the alkyl group may be a methyl group (—CH$_3$), and, as a gas having a bond of Si and the methyl group, TMMAS (Trimethylmethylaminosilane), TMICS (Trimethyl(isocyanato)silane), TMSA (Trimethylsilylacetylene), TMSC (Trimethylsilycyanide), DMSDMA (Dimethylsilydimethylamine), HMDS (Hexamethyldisilazane), TMDS (1,1,3,3-Tetramethyldisilazane), TMSPyrole (1-Trimethylsilylpyrole), BSTFA (N, 0-Bis(trimethylsilyl)trifluoroacetamide), BDMADMS (Bis(dimethylamino)dimethylsilane), and the like can be used, in addition to the TMSDMA.

The above description of the present invention is provided for the purpose of illustration, and it would be understood by those skilled in the art that various changes and modifications may be made without changing technical conception and essential features of the present invention. Thus, it is clear that the above-described embodiments are illustrative in all aspects and do not limit the present invention.

The scope of the present invention is defined by the following claims rather than by the detailed description of the embodiment. It shall be understood that all modifications and embodiments conceived from the meaning and scope of the claims and their equivalents are included in the scope of the present invention.

What is claimed is:

1. A method for recovering a damage of a low dielectric insulating film made of an insulating film having a dielectric constant lower than that of an inorganic silicon oxide film, comprising:
   decomposing a polymer layer generated in a surface of the low dielectric insulating film by a processing by using an ultraviolet decomposition process;
   recovering a damage component of the low dielectric insulating film by substituting, after decomposing the polymer layer, a damaged functional group, which is generated in the surface of the low dielectric insulating film by the processing, with a hydrophobic functional group; and
   further recovering the damage component present under a dense layer generated in the surface of the low dielectric insulating film by the substitution process by using an ultraviolet heating process,
   wherein the dense layer interferes with the substitution process.

2. The method of claim 1, wherein a single wavelength ultraviolet ray within a wavelength range from about 150 nm to 200 nm is used in the ultraviolet decomposition process.

3. A method for manufacturing a semiconductor device, comprising:
   forming, on a semiconductor base body, a low dielectric insulating film made of an insulating film having a dielectric constant lower than that of an inorganic silicon oxide film;
   forming a desired pattern on the low dielectric insulating film by processing the low dielectric insulating film;
   decomposing a polymer layer generated in a surface of the low dielectric insulating film by the processing by using an ultraviolet decomposition process;
   recovering a damage component of the low dielectric insulating film by substituting, after decomposing the polymer layer, a damaged functional group, which is generated in the surface of the low dielectric insulating film by the processing, with a hydrophobic functional group; and
   further recovering the damage component present under a dense layer generated in the surface of the low dielectric insulating film by the substitution process by using an ultraviolet heating process,
   wherein the dense layer interferes with the substitution process.

4. The method of claim 3, wherein a single wavelength ultraviolet ray within a wavelength range from about 150 nm to 200 nm is used in the ultraviolet decomposition process.

5. A method for manufacturing a semiconductor device, comprising:
   forming, on a semiconductor base body, a low dielectric insulating film made of an insulating film having a dielectric constant lower than that of an inorganic silicon oxide film;
   forming a desired pattern on the low dielectric insulating film by processing the low dielectric insulating film;
   irradiating an ultraviolet ray to the semiconductor base body having the low dielectric insulating film of the desired pattern;
   recovering a damage component of the low dielectric insulating film by exposing the semiconductor base body to a reactant gas having a Si—CH$_3$ bond after the irradiation of the ultraviolet ray; and further recovering the damage component present under a dense layer generated in a surface of the low dielectric insulating film by the exposure to the reactant gas by re-irradiating an ultraviolet ray to the semiconductor base body after the exposure to the reactant gas, wherein the dense layer interferes with the recovering process which is performed by the exposure to the reactant gas.

* * * * *